United States Patent
Grill et al.

Patent Number: 6,150,811
Date of Patent: Nov. 21, 2000

[54] MAGNETIC FIELD SENSOR FOR STABLE MAGNETIC FIELD MEASUREMENT OVER A WIDE TEMPERATURE RANGE

[75] Inventors: Thomas Grill, Villingen-Schwenningen; Helmut Bacic, Königsfeld; Martin Gruler, Aixheim; Oliver Springmann, Schramberg, all of Germany

[73] Assignee: Mannesmann VDO AG, Frankfurt, Germany

[21] Appl. No.: 09/043,097
[22] PCT Filed: Oct. 10, 1996
[86] PCT No.: PCT/EP96/04395
 § 371 Date: Apr. 18, 1998
 § 102(e) Date: Apr. 18, 1998
[87] PCT Pub. No.: WO97/14976
 PCT Pub. Date: Apr. 24, 1997

[30] Foreign Application Priority Data

Oct. 18, 1995 [DE] Germany .......................... 195 38 757

[51] Int. Cl.⁷ .................................................. G01R 33/02
[52] U.S. Cl. .......................................... 324/258; 324/225
[58] Field of Search ................................... 324/258, 225, 324/256, 257, 259, 244, 249; 340/870.33

[56] References Cited

U.S. PATENT DOCUMENTS

| | | | |
|---|---|---|---|
| 3,443,213 | 5/1969 | Bader | 324/249 |
| 5,334,944 | 8/1994 | Hirakata | 330/6 |

FOREIGN PATENT DOCUMENTS

| | | |
|---|---|---|
| 0137896 | 4/1985 | European Pat. Off. |
| 0503370 | 9/1992 | European Pat. Off. |
| 0545058 | 6/1993 | European Pat. Off. |
| 2547254 | 5/1976 | Germany |
| 2605414 | 5/1977 | Germany |
| 300492 | 4/1979 | Germany |
| 3637801 | 5/1988 | Germany |
| 4136451 | 5/1993 | Germany |
| 4334708 | 4/1995 | Germany |

*Primary Examiner*—Jay Patidar
*Attorney, Agent, or Firm*—Martin A. Farber

[57] ABSTRACT

A magnetic field sensor consists of a cylinder (2) with a core of premagnetized amorphous ferromagnetic metal. The inductance of the coil (2) is controlled by earth magnetic field $H_E$ and forms part of an L.C. oscillator (1). An adjusting device is provided to smooth out fluctuations from a target value in the oscillator frequency caused by the action of the field $H_E$ on the oscillator coil (2). This is done by allowing another adjustable magnetic field to influence the inductance (2) of the oscillator (1): the adjustable magnetic field is generated by a second coil (3) in the form of a compensating coil and the current flux (1) through the second coil (3) is controlled by the adjusting device in such a way that the magnetic field generated by the second coil (3) compensates for the action of the field $H_E$ on the first coil (2); and a control logic element (8) changes the polarity of the current flux (I) through the compensating coil (3) at a rate which matches the fluctuations with time of the field $H_E$ by synchronous actuation of switches (9a) and (9b). Where the field $H_E$ is present for both current directions, the respective compensating currents are measured and the difference determined as the variable proportional to the field strength of the field $H_E$.

7 Claims, 3 Drawing Sheets

MAGNETIC FIELD SENSOR FOR STABLE MAGNETIC FIELD MEASUREMENT OVER A WIDE TEMPERATURE RANGE

FIELD AND BACKGROUND OF THE INVENTION

The invention relates to a magnetic field sensor.

A direction-change sensor is known from document EP 545 058 A1, for an accident-recording device that can be used in motor vehicles, with at least two cylindrical coils disposed at right angels to one another and each having a core made of amorphous ferromagnetic metal, with the geometric axes of the coils being aligned essentially horizontally following the installation of the accident data recording device in a motor vehicle, and with the inductances of the coils being controlled by the earth's magnetic field, with essentially similarly constructed oscillators being provided, each comprising one of the coils, and with the amorphometallic cores of the coils being biased in a permanently magnetic fashion to establish the working ranges of the oscillators. The magnetic bias on the coil cores is generated by permanent magnets, preferably in the shape of rods, located In the vicinity of the coils, with the magnetic fields of these permanent magnets penetrating the coils. By the magnetic biasing, frequency changes of the oscillator, caused by the influence of the earth's magnetic field, can be tapped in the linear range of its f/B curve. The determination of the working point of the oscillator by the field of the permanent magnet involves consideration of a practically oriented signal travel signal deviation which results when the earth's magnetic field is superimposed on the bias.

EP 503 370 A1 contains a proposal for the design of the coil for an oscillator controlled by a magnetic field, with a coil body, a winding, and a coil core made of amorphous ferromagnetic metal.

The arrangement according to EP 545 058 A1 has the disadvantage that the desired working point is not stable under automotive operating conditions, directly affecting the quality of the measurement. The measuring system described in the document is subject to temperature drift, because both the magnetic properties of the permanent magnet and the magnetization of the amorphometallic coil core change as a function of temperature. Even when the temperature pattern of the material of which the permanent magnet is made and that of the coil core behave in opposite ways, it is extremely difficult to find pairs of materials in which the influence of temperature on amorphous metal and on the permanent magnet offset one another in the desired working range, so that in practice undesired temperature influences are always superimposed on the measurement result.

In addition, magnetic field sensor systems of this type have the disadvantage of a high calibration cost to set the working point of the oscillator. For calibration, the permanent magnet producing the magnetic bias is moved around in the vicinity of the coil(s) until the position of the permanent magnet that defines the desired working points is determined by measuring the voltage indicated in the coil(s). Then the permanent magnet must be secured in this position. This procedure is too cumbersome for a mass-produced product, and in addition this procedure can be performed only in a magnetically shielded measuring chamber in order to eliminate any superimposition of the earth'magnetic field during the calibration process.

Magnetic field sensor systems with a permanent magnet located in the vicinity of the measuring coil also have the disadvantage that it is difficult to locate the permanent magnet in such a position that its magnetic field passes homogeneously through the coil. For this purpose, special, expensive shaping procedures for the magnet are required. Nonuniform penetration of the coils by the permanent magnet however has a disadvantageous effect on the measurement accuracy that can be achieved with the measuring system.

SUMMARY OF THE INVENTION

All of these disadvantages, in the light of the automotive application, the conditions of mass production, and the cost scales that apply in motor vehicle instrumentation, dictate another solution for a magnetic field sensor according to this type. It is the particular goal of the present invention to find a solution that ensures stable magnetic field measurement over a wide temperature range.

According to the invention a magnetic field sensor, comprises a) first coil (2) with a ferromagnetic metal core, the inductance of this coil (2) being controllable by the earth's magnetic field ($H_E$), said coil (2) being part of an oscillator (1), and the working range of the oscillator (1), based on the frequency, being determined by the permanent self-magnetization of the metal core, b) and a regulating device (15) that compensates for the variations of the oscillator frequency (fosc) that are produced by the earth's magnetic field ($H_E$) acting on the first coil (2), from a set working frequency (fosc set) that is the oscillator frequency without the influence of the earth's magnetic field ($H_E$), by influencing the inductance of the oscillator (1) by means of an additional regulatable field that can be regulated, a second coil (3), through which the current flows, generating this regulatable magnetic field and the regulating device (15) regulating the current flow (I) through the second coil in such fashion that the magnetic field generated by the second coil (3) compensates for the effect of the earth's magnetic field ($H_E$) acting on the first coil (2), c) switches (9a and 9b) are provided in the leads to the second coil (3), said switches each simultaneously actuating a first control unit (8), so that the direction of the current flow (J) through the second coil (3) is reversed, d) the first control unit (8) throwing the switches (9a and 9b) with a frequency greater than the frequency of change of direction of the flux through the first coil (2) as determined by the earth's magnetic field, and to connect the output of the magnetic field sensor with a computer circuit which, in the presence of the earth's magnetic field ($H_E$), first determines for both current flow directions, the respective values (I1 and I2) for the current flow in both directions and then determines the difference between these two values (I1 and I2) as a measurement signal that is proportional to the field strength of the earth's magnetic field ($H_E$).

In this way, the changes in oscillator frequency caused by the earth's magnetic field are adjusted by the regulating device to a set working frequency by virtue of the fact that the inductivity of the oscillator, which consists of a coil with an amorphometallic core, is influenced by a second magnetic field that can be regulated in a specific fashion and which is analyzed to regulate the energy required to calibrate the oscillator frequency as a function of the strength of the earth's magnetic field. For this purpose a second coil, the so-called compensating winding, is preferably wound on top of the first coil, i.e. the oscillator coil. The current flowing through this second coil is regulated by an electronic regulating device in such fashion that the magnetic field generated by the second coil directly compensates for the influence of the earth's magnetic field on the first coil. For this purpose, the oscillator frequency is supplied through a suitable electronic adapter to a regulator that influences the current flow through the second coil following a comparison of the oscillator frequency at the moment with a set working frequency stored in the regulating device with regard to the established deviations of the oscillator frequency from its set working frequency in order to return the oscillator frequency at the moment the set working frequency by altering the magnetic field of the second coil. The energy required for this purpose is proportional to the strength of the earth's magnetic field acting on the first coil and can therefore be used as a measurement signal.

The adjustment of the working point of the oscillator as performed in the prior art by a permanent magnet can be accomplished in the present solution also by the magnetic field generated by passing a current through the second coil, so that the strength of the current, provided by the regulating device in the absence of the earth's magnetic field, required to reach the working point of the oscillator determines the basic level of the operating current through the second, i.e. the compensating coil.

When the direction of the current flowing though the second coil is reversed by a suitable first control unit with a frequency such that the direction of current flow changes more rapidly than the direction of the flow through the first coil as determined by the earth's magnetic field, and when the respective strength of the current through the second coil required for compensation of the earth's magnetic field is measured for both current directions in the presence of the earth's magnetic field by calculation of the difference between the two amounts for the current, a measurement signal is obtained that is proportional to the strength of the earth's magnetic field and is free of temperature influences, since the subtraction of the two amounts for the current, the amount subject to response to temperature changes and the amount required for setting the working point of the oscillator, allows the current provided by the regulating device to stand out clearly.

Moreover, if parasitic current elements of the first coil are also to be eliminated, it is recommended to switch the direction of current flow though this first coil in cycles, likewise by a further control unit.

BRIEF DESCRIPTION OF THE DRAWINGS

With the above and other objects and advantages in view, the present invention will become more clearly understood in connection with the detailed description of the preferred embodiment, when considered with the accompanying drawings of which.

DETAILED DESCRIPTION OF THE PREFERRED EMBODIMENT

Figure 1:
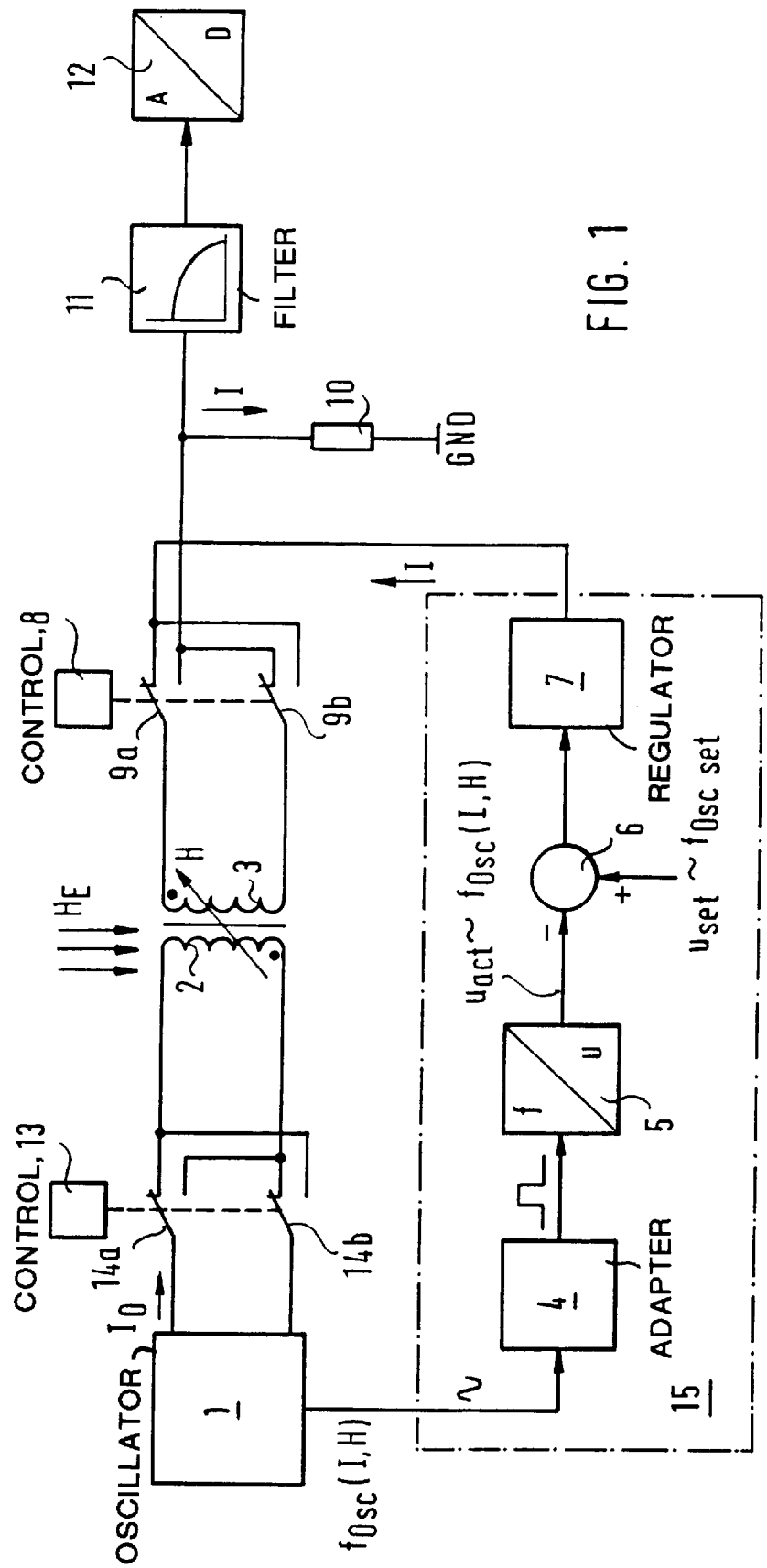
FIG. 1 shows a block diagram of the magnetic field sensor according to the invention.

In FIG. 1, reference number 1 refers to and LC oscillator operated with a first coil 2. In order to keep the oscillator frequency $f_{osc}$ constant despite the influence of an earth's magnetic field $H_E$ on inductance 2, the sinusoldal oscillator frequency $f_{osc}$ that depends on the field strength is initially preferably converted by a suitable adapter circuit 4 into a square-wave signal that can be evaluated digitally and is then supplied to a frequency-voltage converter 5, whose output is connected to a subtraction member 6, in which a voltage value $U_{act}$ that is proportional to the current oscillator frequency $F_{osc}$ is subtracted form a permanently set voltage setpoint $U_{set}$ that corresponds to the ideal set working frequency $F_{osc\ set}$ of the oscillator. The set working frequency $f_{osc\ set}$ of the oscillator is the frequency that the oscillator assumes at its working point in the unloaded state, in other words the absent of the earth's magnetic field. Strictly speaking ($H_E$), represents the component of the earth's magnetic field in the lengthwise direction of the coil. The difference between the two voltage values $U_{set}$ and $U_{act}$ is fed to a regulator 7 designed for example as a PI regulator that adjusts the current I for the second coil 3 acting as a compensating coil in such fashion that the voltage difference ($U_{set}-U_{act}$) tends toward zero and the change caused by earth's magnetic field $H_E$ in inductance of the first coil 2 and the resultant change in the oscillator frequency $f_{osc}$ are compensated, so that the oscillator frequency $f_{osc}$ remains more or less constant, depending on the regulating speed of the regulating device. In the practical embodiment, the second coil 3 is applied by winding it on top of the first coil 2, while both coils remain electrically insulated from one another. It is advantageous to arrange the two coils so that their winding directions are opposite.

The amplitude of the current flow I for the second coil 3 is directly proportional to the strength of the component of the earth's magnetic field $H_E$ in the lengthwise direction of the coil and thus changes in the same way as the strength of the earth's magnetic field. The actual measured parameter can therefore be derived directly by evaluating the amplitude of the current I. For this purpose, the current I flowing through the second coil 3 is fed through a bypass resistor 10 to ground GND in order to make it possible to evaluate the current I as a voltage signal. However, since only the DC component of this voltage signal is a parameter that is proportional to the measured parameter, the voltage signal is fed through a filter member 11 designed as a lowpass to an analog/digital converter 12 for further processing. Further evaluation is performed by a $\mu$p supported calculating circuit which will however not be described in greater detail here, since its design is not essential to the invention. The $\mu$P-supported calculating circuit that picks up the measuring signal at the output of the analog/digital converter 12 is therefore likewise not shown in FIG. 1.

To reverse the polarity of the current flow direction of the second coil 3, its two electrical terminals are each connected to the reversing switches 9a and 9b that switch synchronously and can be operated by a control unit 8. Similarly, the two electrical terminals of the first coil 2 can be guided through the synchronously switching reversing switches 14a and 14b that can be operated by a control unit 13 in order to switch the current flow $I_o$ through the first coil 2 so in alternate directions, to eliminate parasitic current elements in the oscillator. Parasitic current elements are disturbing factors that result from the fact that the alternating field of the LC oscillator 1 is not ideal but, as a result of the design of the oscillator circuit, has a DC component superimposed on it that results from an unavoidable cross current in the oscillator 1. In the practical implementation, the control units 8 and 13 can be the same and can also be assembled from modules. The control units 8 and 13 switch the reversing switches 9a, 9b, 14a, and 14b that they actuate, pairwise in synchronization and with the same frequency, with the frequency being in the millisecond range.

Figure 2A:
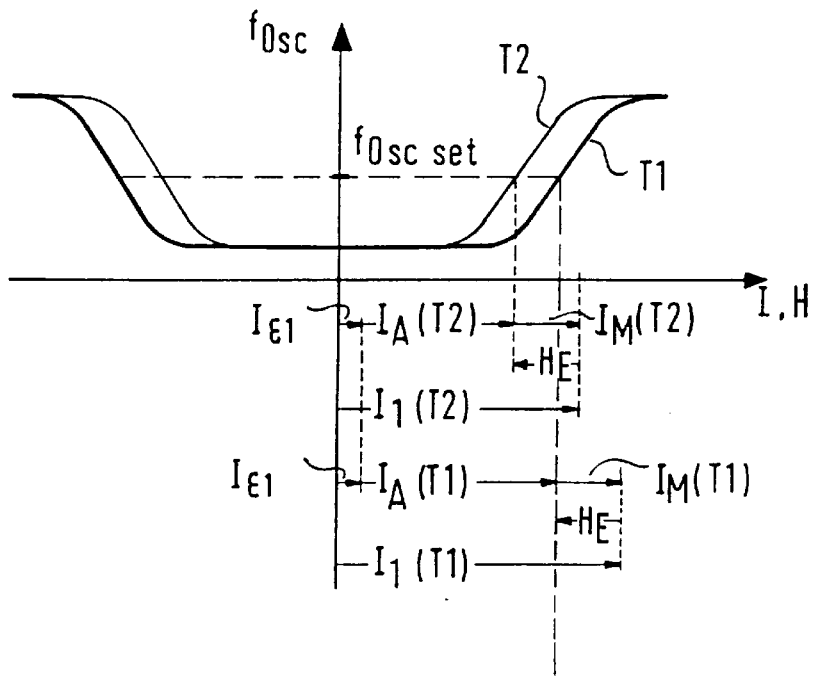
FIGS. 2A and 2B show the working curve of its regulating circuit for both directions of the current flow in the second coil.

FIG. 2A shows the working curve of the regulating device at two different operating temperatures T1 and T2. The frequency $f_{osc}$ of the oscillator 1 is plotted against the field strength H, composed of the bias voltage and the earth's magnetic field, of the magnetic field acting on the first coil 2 and/or the current I, proportional to the field strength H, of the second coil 3. The switches 9a and 9b assume in FIG. 2A the position shown in FIG. 1.

Figure 2B:
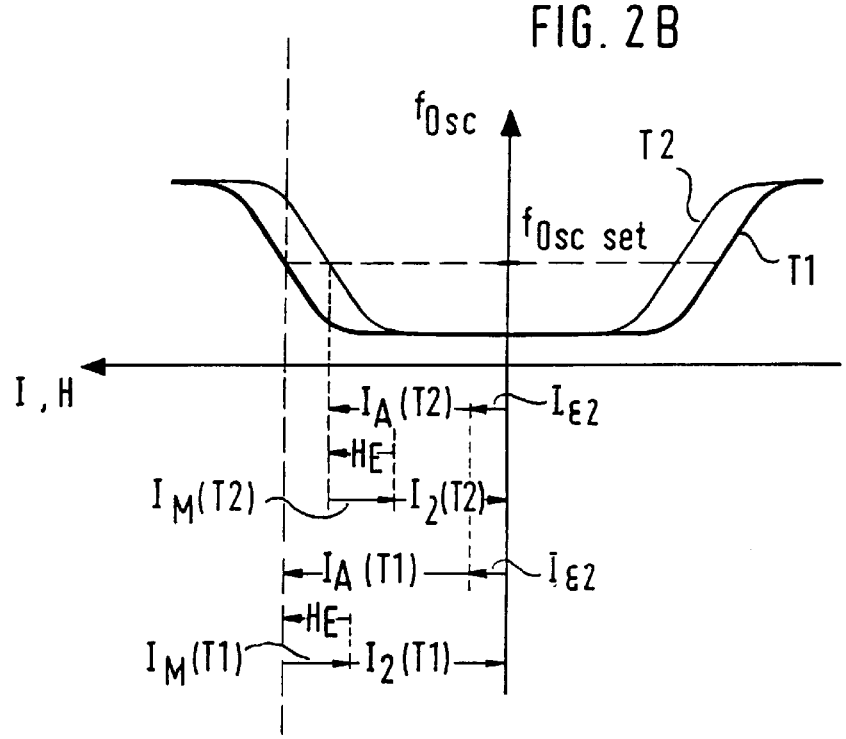

FIG. 2b shows the same working curve, likewise for operating temperatures T1 and T2, but with the direction of the flow of the current through the second coil 3 reversed, in other words following actuation of the switches 9a and 9b.

The amplitude of compensating current I through the second coil 3 is composed of three components:

1. A portion $I_A$ for setting the working point of the oscillator 1 to the set working frequency $f_{osc\ set}$ to be kept constant by the regulating device;
2. A portion $I_{s1}$ or $I_{s2}$ for compensating the parasitic disturbing influences in the oscillator 1, and
3. The component $I_M$ that is required for compensating for the component of the earth's magnetic field $H_E$, so that the current I to be applied by the regulator 7 in the first flow direction through the second coil 3 can be represented as follows:

$$I_1 I_A = I_{s1} + I_M$$

The portion $I_A$ for setting the working point changes in value depending on the position of the working curve in the $f_{osc}/(I,H)$ graph, with the curve being able for example to assume the position shown in FIGS. 2a and 2b at temperatures T1 and T2. After the flow direction in the second coil 3 has been changed by operating the switches 9a and 9b, the total required current I in the presence of the same components of the earth's magnetic field $$H_E\ \text{is}\ I_2 = I_A + I_{s2} - I_M.$$

If the differenced between $I_1$ and $I_2$ is generated at a certain temperature (for example T1 or T2), we have:

$$I_1 - I_2 = (I_1 + I_{o1} + I_M) - (I_A + I_{s2} - I_M) = (I_{s1} - I_{s2}) + 2\ I_M \approx 2\ I_M$$

since the portion $(I_{s1} - I_{s2})$ can be shifted toward zero by subjecting the first coil 2 to a current flow that changes direction. Depending on the accuracy requirements for the magnetic field sensor, the use of switches 14a and 14b required for changing the direction of current flow can even be eliminated since the portion $(I_{s1} - I_{s2})$ is very small in terms of value by comparison with $I_M$.

Figure 3:
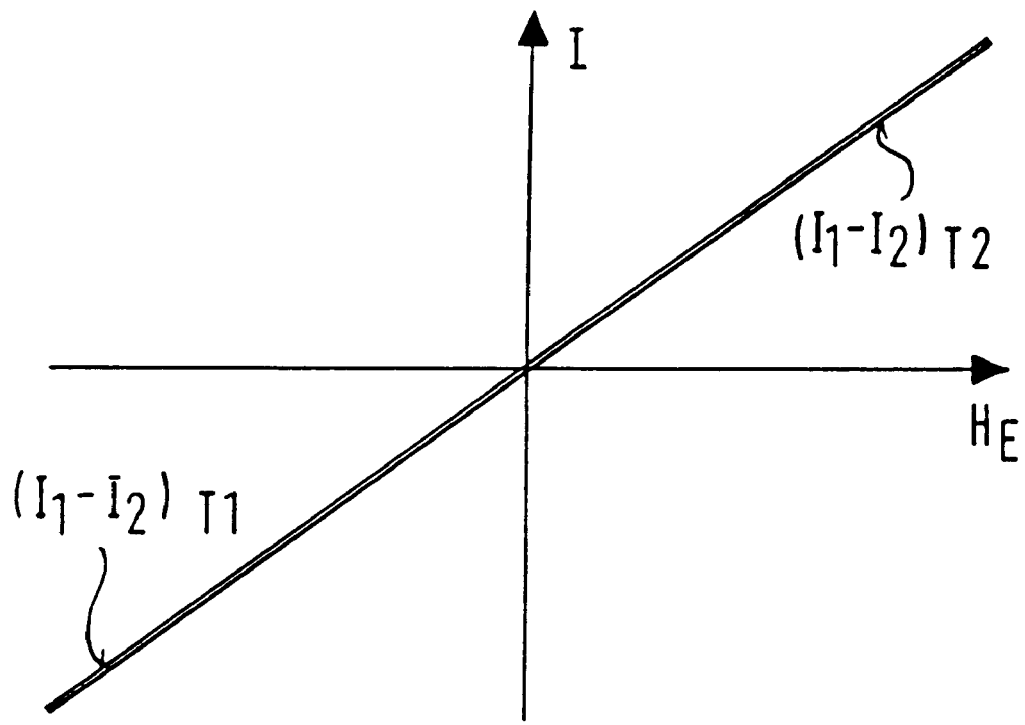
FIG. 3 shows the linear relationship between the difference between the two components of the compensating current for both directions of current flow in the second coil and the field strength of the earth's magnetic field.

It is significant that the current $I_M$ is directly proportional to the field strength of the earth's magnetic field $H_E$, related by a geometric constant of the coil that consists of the coil length and the number of turns. This relationship in clarified in FIG. 3 in which the differential current $(I_1 - I_2)$ is plotted against the field strength of the earth's magnetic field $H_E$.

Therefore, the proposed circuit represents a solution that makes it possible to construct a magnetic field sensor by taking into account the automotive application, the conditions of mass production, and the cost scales that apply in motor vehicle instrumentation. In particular, the goal is achieved of having magnetic field measurement that is stable over a wide temperature range by using the difference measurement method that can easily be performed with this circuit.

What is claimed is:

1. A magnetic field sensor comprising:
   an oscillator comprising an oscillation circuit, and a first coil with a ferromagnetic metal core, inductance of said first coil being responsive to the earth magnetic field, said oscillator providing a frequency of oscillation determined by a permanent self-magnetization of the metal core of said first coil;
   a second coil, and a regulator circuit applying current to said second coil for establishing a magnetic field in said second coil, the magnetic field of said second coil coupling said first coil and summing with a magnetic field established in said first coil by said oscillator circuit;
   switch means interconnecting said regulator circuit with said second coil for receiving a direction of current flow in said second coil;
   a control unit for operating said switch means to reverse current flow in said second coil at a switching frequency greater than a frequency of change of direction of the earth magnetic field within said first coil; and
   means for measuring the current in said second coil to output a current measurement for each direction of the current flow, said measurement being suitable for operation of a computer for determining a difference between a current measurement for a first direction of the current flow and a current measurement for a second direction of the current flow, said difference in current measurements being proportional to the strength of the earth magnetic field;
   whereby said regulator circuit compensates for variations in said oscillator frequency resulting from the presence of the earth magnetic field within said first coil in order to establish a set value of working frequency for said oscillator, said set value being the value of the absence of influence of the earth magnetic field.

2. Magnetic field sensor according to claim 1, wherein said regulator circuit comprises:
   an adapter electronics for converting a sinusoidal output signal of said oscillator to a square wave signal;
   a frequency-to-voltage converter for converting a frequency of said square wave signal to a voltage level;
   a subtracter for forming a difference between said frequency voltage level and a reference voltage level; and
   a regulator responsive to said difference of voltage levels for applying said current to said second coil.

3. Magnetic field sensor according to claim 2, wherein said reference voltage level establishes said set value of working frequency of said oscillator.

4. Magnetic field sensor according to claim 1, wherein said second coil is wound over said first coil.

5. Magnetic field sensor according to claim 1, wherein said switch means connected to said second coil is a second switch means, the field sensor further comprising a first switch means interconnecting said first coil with said oscillator circuit for reversing a direction of current flow in said first coil;
   said control unit operating said second switch means is a second control unit, the field sensor further comprising a first control unit for operating said first switch means to reverse current flow in said first coil at a switching frequency greater than a frequency of change of direction of the earth magnetic field within said first coil, a reversal of current direction in said first coil serving to eliminate parasitic current elements in said oscillator.

6. Magnetic field sensor according to claim 5, wherein said first control unit and said second control unit are operated synchronously at a common switching frequency.

7. Magnetic field sensor according to claim 6, wherein a period of said switching frequency is in a millisecond range.

* * * * *